US008237472B2

(12) United States Patent
Kuo et al.

(10) Patent No.: US 8,237,472 B2
(45) Date of Patent: Aug. 7, 2012

(54) FREQUENCY MULTIPLIER DEVICE AND METHOD THEREOF

(75) Inventors: Chien-Nan Kuo, Hsinchu (TW); Tzu-Chao Yan, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 183 days.

(21) Appl. No.: 12/730,312

(22) Filed: Mar. 24, 2010

(65) Prior Publication Data

US 2011/0187420 A1 Aug. 4, 2011

(30) Foreign Application Priority Data

Jan. 29, 2010 (TW) ................................ 99102734 A

(51) Int. Cl.
*H03B 19/00* (2006.01)

(52) U.S. Cl. ......... 327/119; 327/116; 327/120; 327/122

(58) Field of Classification Search ................ 327/115, 327/116, 117, 118, 355–361, 202, 203, 208–212, 327/218; 377/47, 48; 455/326–333
See application file for complete search history.

(56) References Cited

U.S. PATENT DOCUMENTS

| 5,596,302 A * | 1/1997 | Mastrocola et al. ............ 331/57 |
| 6,535,037 B2 * | 3/2003 | Maligeorgos ................. 327/116 |
| 6,687,493 B1 * | 2/2004 | Sorrells et al. ................ 455/323 |
| 6,850,746 B1 * | 2/2005 | Lloyd et al. .................... 455/272 |
| 7,130,604 B1 * | 10/2006 | Wong et al. .................... 455/302 |
| 7,299,006 B1 * | 11/2007 | Rofougaran et al. ........... 455/20 |
| 7,509,110 B2 * | 3/2009 | Hayashi et al. ................ 455/302 |
| 2002/0039039 A1 * | 4/2002 | Maligeorgos ................. 327/116 |
| 2004/0061544 A1 * | 4/2004 | Watanabe et al. ............. 327/359 |
| 2008/0311860 A1 * | 12/2008 | Tanaka et al. .................. 455/73 |
| 2011/0050319 A1 * | 3/2011 | Wong ............................ 327/356 |
| 2011/0136460 A1 * | 6/2011 | Cho et al. ...................... 455/302 |

* cited by examiner

*Primary Examiner* — Lincoln Donovan
*Assistant Examiner* — Brandon S Cole
(74) *Attorney, Agent, or Firm* — Volpe and Koenig, P.C.

(57) ABSTRACT

The present invention provides a method for identifying a specific number of communicating points having relatively smallest accumulated path values from a plurality of transmitting points for a receiving point in a communication system. The method includes steps of: (a) defining a first coordination of each of the plurality of transmitting points and the receiving point on a complex plane; (b) transferring the first coordination of the receiving point to a second coordination thereof, in which the second coordination of the receiving point is near an origin of the complex plane; and (c) identifying the specific number of transmitting points having relatively smallest accumulated path values based on the second coordination of the receiving point.

18 Claims, 17 Drawing Sheets

FREQUENCY MULTIPLIER DEVICE AND METHOD THEREOF

FIELD OF THE INVENTION

The present invention relates to a frequency multiplier, particularly a frequency multiplier device capable of suppressing harmonics in an electronic circuit.

BACKGROUND OF THE INVENTION

Traditional oscillation circuits can by categorized into RC oscillators, LC oscillators and crystal oscillators. The major component designed in the basic structure of these circuits is a calculation magnifier. However, the oscillation circuits based on the design of a calculation magnifier is constrained by the gain bandwidth product, which is a big deficiency for the design of high-frequency circuits, for example, the Wien-bridge oscillator. As for the LC oscillators, such as Hartley and Colpitts oscillators, the components therein are easily affected by either the temperature coefficients or the stray capacitances/resistances thereof and resulted in change of the oscillation frequency. Usually, the temperature coefficients are higher than 100 ppm/° C. (which equivalent to a change of 0.03% per 10° C.). Therefore, the stability of the LC oscillators is not good.

Instead of the traditional oscillators, frequency synthesizers can be utilized for generating RF signals have frequencies of tens of Giga Hertz, while suffering extensive power consumption and phase noises. Another method is to input a low-frequency signal to a frequency multiplier, to generate high oscillation frequencies. However, the method has deficiencies such as low output power and poor harmonic rejection ratio, HRR.

Please refer to FIG. 1, which schematics the signal generates by a push-push oscillator known to the art. According to FIG. 1, a first fundamental frequency signal S1 having a first fundamental frequency $f_{01}$ is a sine wave having a positive phase. A second fundamental frequency signal S2 having a second fundamental frequency $f_{02}$ is a sine wave having a negative phase. The first fundamental frequency $f_{01}$ is equal to the second fundamental frequency $f_{02}$. The second-order harmonic of the first fundamental frequency signal S1 has a frequency which is two times of the first fundamental frequency $f_{01}$. The second-order harmonic of the second fundamental frequency signal S2 also has a frequency which is two times of the first fundamental frequency $f_{01}$. The second-order harmonics of the first and the second fundamental frequency signals, S1 and S2, have the same phase. Therefore, the amplitudes of the two second-order harmonics can be added and a double-frequency signal S3 is obtained. The double-frequency signal S3 has a double fundamental frequency $2 f_{01}$, which is two times as much as the first fundamental frequency $f_{01}$. The phases of odd-number-order harmonics of the first fundamental frequency signal S1 are opposite to that of the second fundamental frequency signal S2 and therefore each couple of the odd-number-order harmonics eliminate each other.

Please refer to FIG. 2(A), which is a circuit diagram of the push-push oscillator known to the art. The push-push oscillator 20 comprises transistors 201 and 202, inductors 203 and 204, a current source 205 and a conducting line 206. The inductor 203 has an end A and an end B. The inductor 204 has an end C and an end D.

According to FIG. 2(A), the gate $G_{10}$ of the transistor 201 is coupled to the drain $D_{20}$ of the transistor 202, the gate $G_{20}$ of the transistor 202 is coupled to the drain $D_{10}$ of the transistor 201, the source $S_{10}$ of the transistor 201 and the source $S_{20}$ of the transistor 202 is coupled to the current source 205, the end A of the inductor 203 is coupled to the drain $D_{10}$ of the transistor 201, the end B of the transistor 203 is coupled to the conducting line 206, the end C of the inductor 204 is coupled to the drain $D_{20}$ of the transistor 202, and the end D of the inductor 204 is coupled to the conducting line 206.

The push-push oscillator 20 generates the first fundamental frequency signal S1 at the drain $D_{10}$ of the transistor 201, and the second fundamental frequency signal S2 at the drain $D_{20}$ of the transistor 202. The double-frequency signal S3 having the double fundamental frequency $2 f_{01}$ is obtained at the junction of the conducting line 206, end B and end D.

Please refer to FIG. 2(B), which is a circuit diagram of the injection-locked frequency multiplier known to the art. The injection-locked oscillator 21 comprises the push-push oscillator 20 excepting the conducting line 206, and further comprises transistors 211 and 212, buffers 213 and 214, and a current source 215. The buffers 213 and 214 have an input and an output terminals, in+ and out+, and in− and out−, respectively.

The circuit layout is illustrated in FIG. 2(B). According to FIG. 2(B), a differential signal $S_{D1}$ having a fundamental frequency f is inputted at the gate G30 of the transistor 211 and the gate 40 of the transistor 212 respectively. The differential signal $S_{D1}$ includes a DC and an AC components. The transistors 211 and 212 are biased at non-linear regions by the DC component. Passing through the transistor 211, the AC component is transformed and then generates a harmonic signal $S_{D2}$, which includes a positive-phase triple-frequency harmonic component having a triple fundamental frequency $3f_1$, at the drain $D_{30}$. The positive-phase triple fundamental frequency $3f_1$ is three times of the fundamental frequency f. The harmonic signal $S_{D2}$ is inputted at the input terminal in+ of the buffer 213. Similarly, passing through the transistor 212, the AC component is transformed and then generates a harmonic signal $S_{D3}$, which includes a negative-phase triple-frequency harmonic component having a triple fundamental frequency $3f_2$, at the drain $D_{40}$. The negative-phase triple fundamental frequency $3f_2$ is three times of the fundamental frequency f. The harmonic signal $S_{D2}$ is inputted at the input terminal in− of the buffer 214.

Although the injection-locked frequency multiplier 21 can inject as well as lock the oscillation frequency of the signal from the push-push oscillator 20, the oscillation frequency of the signals generated by the injection-locked frequency multiplier 21 are easy to be disturbed by other harmonics. The method of injecting all the harmonics into the push-push oscillator 20 while suppressing unwanted frequencies by employing the mechanism of injection-locking thereof may result in poor harmonic rejection ratio, which affects the quality of the oscillation signals.

SUMMARY OF THE INVENTION

To overcome the abovementioned drawback, the present invention provides a frequency multiplier device. The frequency multiplier comprises a harmonic generator and a harmonic suppressor. The harmonic generator receives an input signal having a fundamental frequency, and produces a harmonic signal including a first and a second harmonic components. The harmonic suppressor receives the harmonic signal, suppresses the first harmonic component, and outputs the second harmonic component. The first harmonic component comprises a first-order harmonic having the fundamental frequency and plural even-number-order harmonics, each of which has a frequency of an even-number-times of the fundamental frequency. The second harmonic component comprises a third-order harmonic having a frequency equal to three-time of the fundamental frequency. The harmonic suppressor enhances the second harmonic component.

Preferably, the frequency multiplier device further comprises a specific harmonic application device receiving the enhanced second harmonic component. The specific harmonic application device is an oscillator having an oscillation frequency and locked at three-time of the fundamental frequency by the third-order harmonic with an injection-locking method.

Preferably, the harmonic suppressor comprises at least a filter and a harmonic suppression circuit, which comprises a plurality of transistors and a plurality of capacitors and suppresses the even-order harmonics.

Preferably, the filter is a notch filter comprising an inductor and a capacitor, and the inductor and the capacitor are coupled in series.

Preferably, the notch filter comprises a first capacitor, an inductor and a second capacitor, the first capacitor is coupled to the inductor in parallel to for a first circuit, and the second capacitor is coupled to the first circuit in series. The notch filter suppresses the first-order harmonic. The plurality of transistors include one of a bi-polar transistor and a field-effect transistor.

Preferably, the plurality of transistors comprises a first and a second transistors. The first transistor has a first gate, a first drain, and a first source. The second transistor has a second gate, a second drain, and a second source. The plurality of capacitors comprises a first and a second capacitors. The first capacitor has a first and a third ends, and the second capacitor has a second and a fourth ends. The first gate is coupled to the fourth end, the second gate is coupled to the third end, the first source is coupled to the first end, and the second source is coupled to the fourth end.

Preferably, the harmonic generator is a differential circuit; the input signal comprises a non-phase-inversion fundamental signal and a phase-inversion fundamental signal.

Preferably, the harmonic generator comprises a plurality of transistors, a plurality of capacitors and a plurality of inductors. The plurality of transistors comprise a first transistor having a first gate, a first drain, and a first source; and a second transistor having a second gate, a second drain, and a second source. The plurality of inductors comprise a first inductor having a first and a third ends; and a second inductor having a second and a fourth ends. The plurality of capacitors comprise a first capacitor having a fifth and a seventh ends; and a second capacitor having a sixth and an eighth ends, wherein the first drain is coupled to the first end, the second drain is coupled to the second end, the first and the second sources are grounded, the fifth end is coupled to the first gate, the sixth end is coupled to the second gate, the non-phase-inversion fundamental signal is input into the seventh end, and the phase-inversion fundamental signal is input into the eighth end. The plurality of inductors enhance the third-order harmonic.

In accordance with another aspect of the present invention, a method for processing a signal having a fundamental frequency is provided. The method comprises steps of: (a) generating a first-order, at least an even-number-order and a third-order harmonics based on the fundamental frequency signal; (b) suppressing the first-order and the even-number-order harmonics; and (c) locking an oscillation frequency at the third-order harmonic.

Preferably, the method further comprises steps of: (c1) injecting the third-order harmonic into an oscillator to lock an oscillation frequency at the third-order harmonic; and (d) actuating the oscillator.

In accordance with a further aspect of the present invention, a method for processing a harmonic is provided. The method comprises the steps of: (a) generating a first-order, at least an even-number-order and a third-order harmonics; (b) suppressing the first-order and the even-number-order harmonics; and (c) outputting the third-order harmonic.

The above objects and advantages of the present invention will be more readily apparent to those ordinarily skilled in the art after reading the details set forth in the descriptions and drawings that follow, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 1:
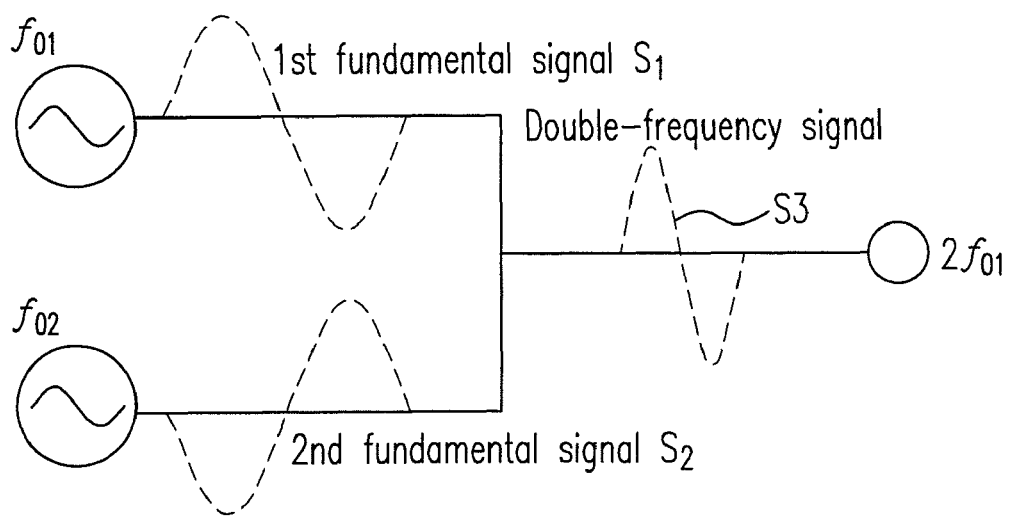
FIG. 1 is a schematic diagram showing the signal generated by a push-push oscillator known to the art.
Figure 2A:
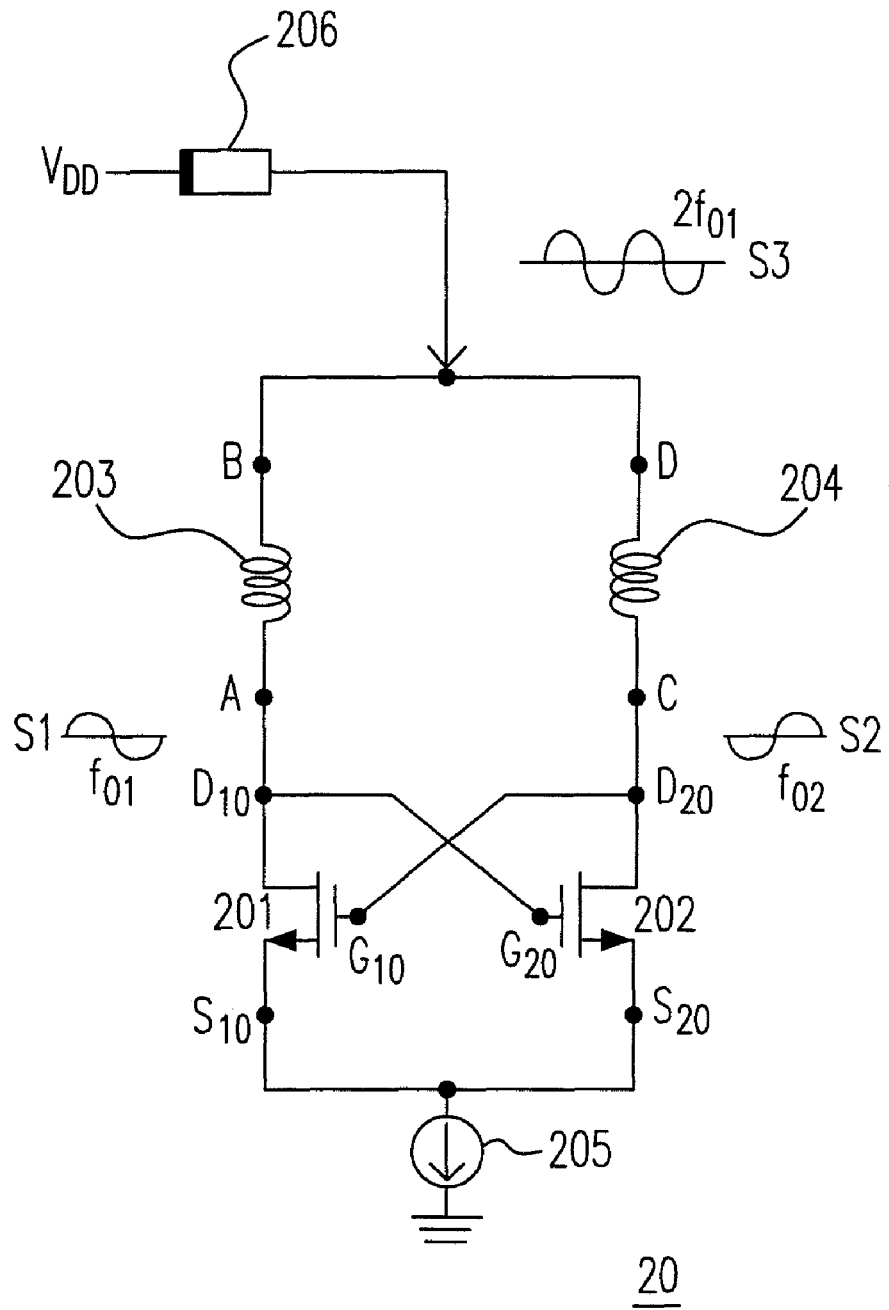
FIG. 2(A) is a schematic diagram illustrating a circuit diagram of the push-push oscillator known to the art.
Figure 2B:
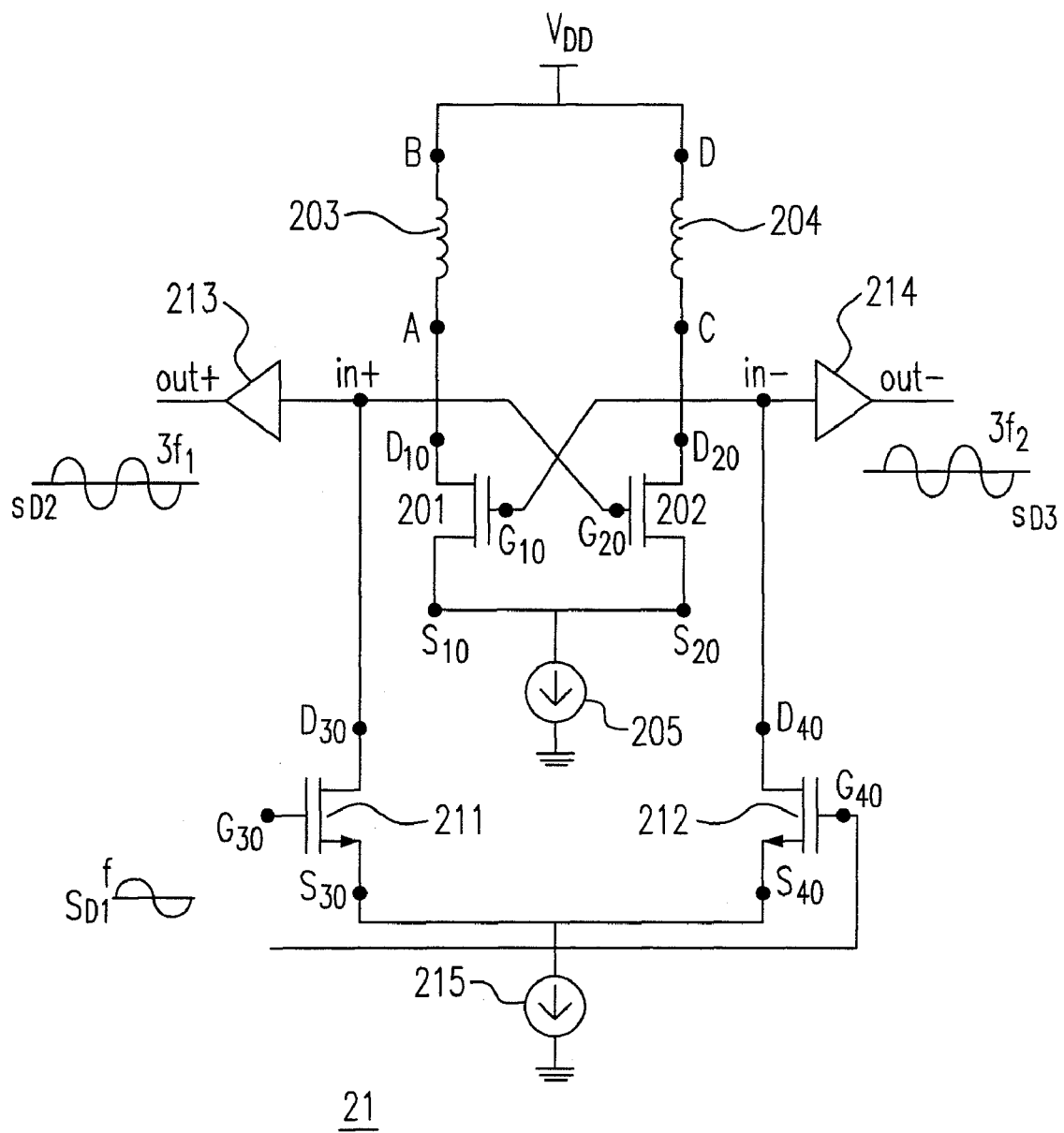
FIG. 2(B) is a schematic diagram illustrating a circuit diagram of the injection-locked frequency multiplier known to the art.
Figure 3A:
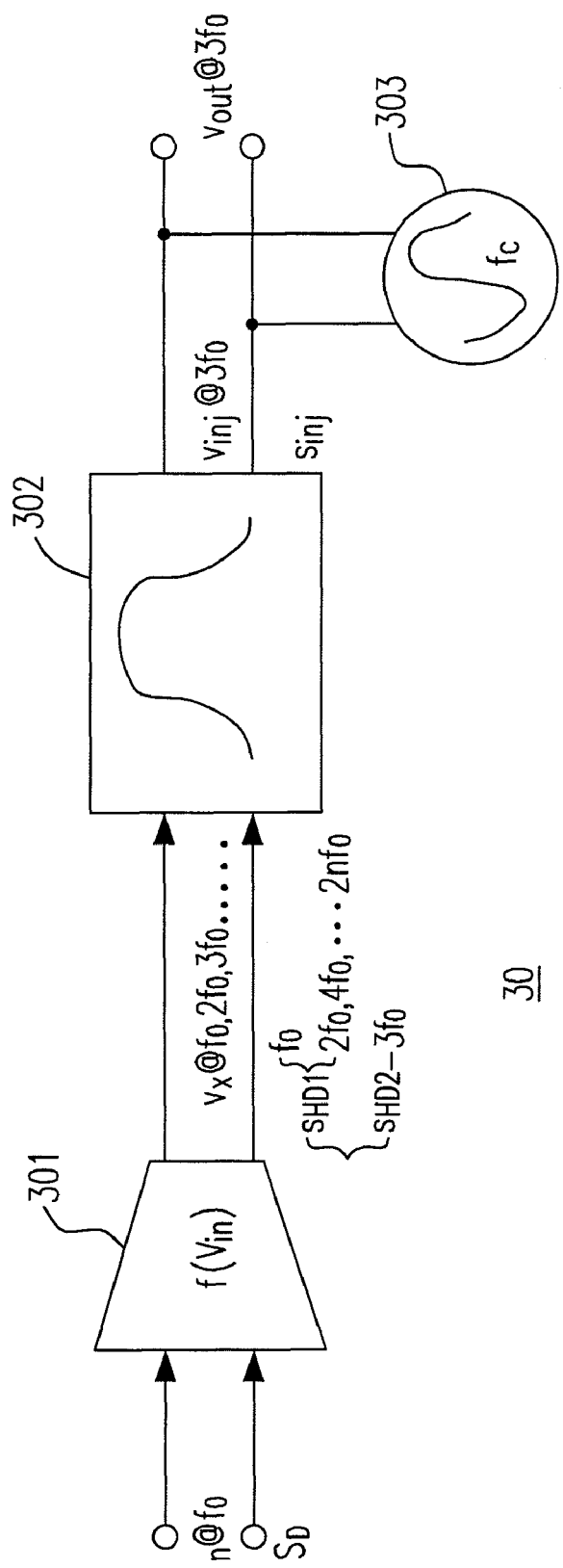
FIG. 3(A) illustrates a schematic diagram showing a frequency multiplier according to the first embodiment of the present invention.

Please refer to FIG. 3(A), a schematic diagram showing a frequency multiplier according to the first embodiment of the present invention. The multiplier 30 includes a harmonic generator 301, a harmonic suppressor, and a specific harmonic application device 303, which is an oscillator. An input signal $S_D$ has a differential voltage Vin, which has a fundamental frequency $f_0$. The harmonic generator 301 receives the input signal $S_D$ and generates a harmonic signal signal $S_H$ with a voltage $V_X$. The harmonic signal $S_H$ includes a first harmonic component $S_{HD1}$ and a second harmonic component $S_{HD2}$. The first harmonic component $S_{HD1}$ comprises a first-order harmonic having the fundamental frequency $f_0$ and plural even-number-order harmonics, each of which has a frequency of an even-number-time of the fundamental frequency $f_0$. The second harmonic component $S_{HD2}$ comprises a third-order harmonic having a frequency equal to three-time of the fundamental frequency $f_0$.

The first-order, the plural even-number-order and the third-order harmonics are inputted into the harmonic suppressor 302, which outputs an injection signal $S_{inj}$ having an injection voltage $V_{inj}$ and a frequency which is three times of the fundamental frequency $f_0$. The oscillation frequency fc of the oscillator 303 is injection-locked at three times of the fundamental frequency $f_0$.

Figure 3B:
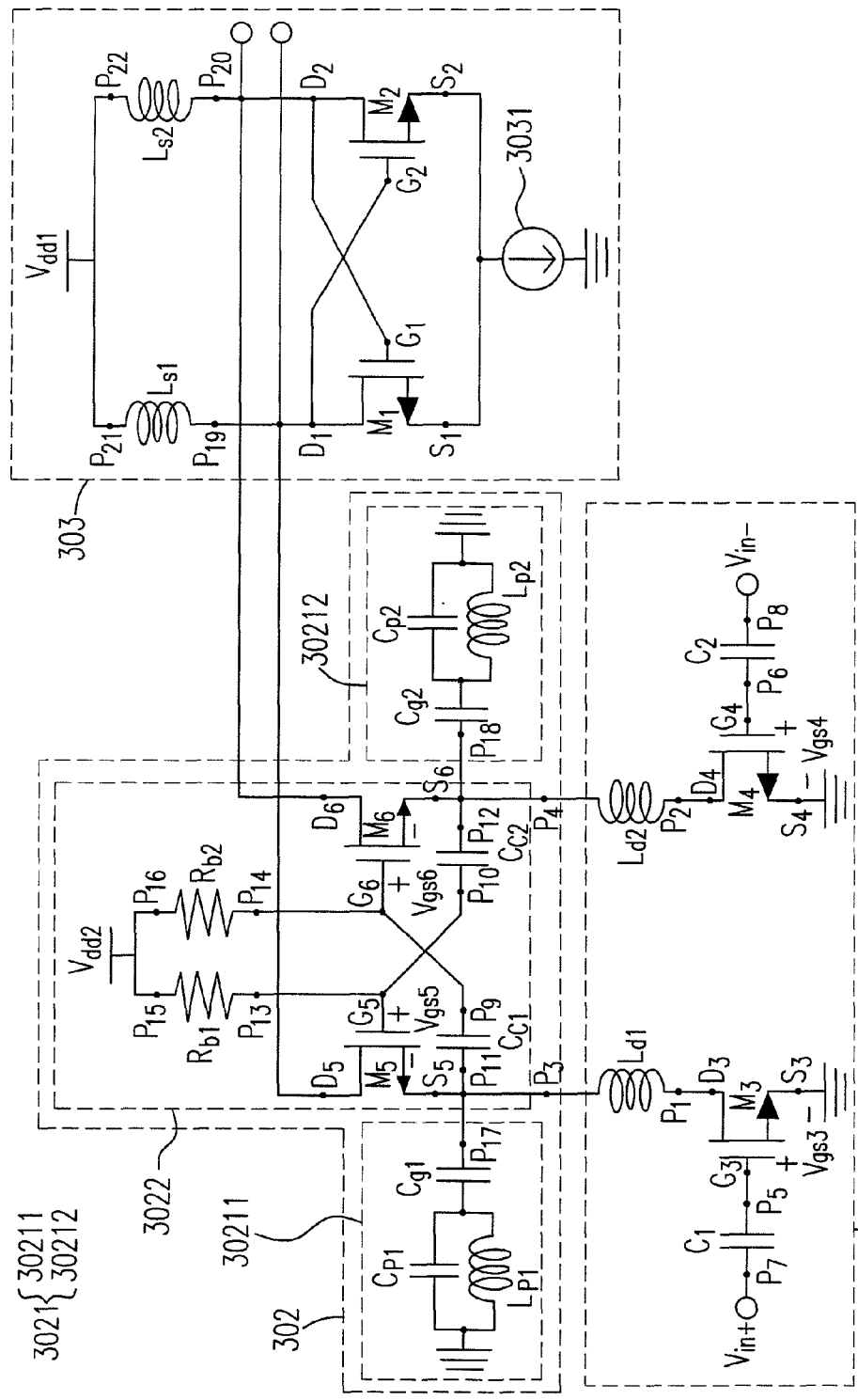
FIG. 3(B) is a circuit diagram of the frequency multiplier according to the first embodiment of the present invention.

Please refer to FIG. 3(B), which is the circuit diagram of the frequency multiplier 30 according to the first embodiment of the present invention. The harmonic generator 301 is a differential circuit, which includes a first transistor $M_3$ having a first gate $G_3$, a first drain $D_3$ and a first source $S_3$, a second transistor $M_4$ having a second gate $G_4$, a second drain $D_4$, and a second source $S_4$, a first inductor $L_{d1}$ having a first end $P_1$ and a third end $P_3$, a second inductor $L_{d2}$ having a second end $P_2$ and a fourth end $P_4$, a first capacitor $C_1$ having a fifth end $P_5$ and a seventh end $P_7$, and a second capacitor $C_2$ having a sixth end $P_6$ and an eighth end $P_8$. The first drain $D_3$ is coupled to the first end $P_1$, the second drain $D_4$ is coupled to the second end $P_2$. The first and the second sources, $S_3$ and $S_4$, are grounded. The fifth $P_5$ end is coupled to the first gate $G_3$. The sixth end $P_6$ is coupled to the second gate $G_4$. A non-phase-inversion fundamental signal Vin+ is inputted into the seventh end $P_7$. Coupled by the first capacitor $C_1$, the AC component of the signal Vin+ is inputted into the first gate $G_3$ of the first transistor $M_3$. A phase-inversion fundamental signal Vin− is inputted into the eighth end $P_8$. The AC voltage signal is coupled by the second capacitor $C_2$ and then inputted into the second gate $G_4$ of the second transistor $M_4$.

The harmonic suppressor 302 comprises a filter set 3021 and a harmonic suppression circuit 3022. The harmonic suppressor 302 receives the harmonic signal $S_H$, and outputs the second harmonic component $S_{HD2}$, which comprises the third-order harmonic having a frequency three times as much as the fundamental frequency $f_0$. The filter set 3021 includes two notch filters, 30211 and 30212, for suppressing fundamental frequencies. The notch filter 30211 comprises two capacitors, Cp1 and Cg1, and an inductor Lp1. The capacitor Cp1 is coupled to the inductor Lp1 in series to form a circuit, and the circuit is coupled to the capacitor Cg1 in parallel. Alternatively, the inductor Lp1 and the capacitor Cg2 can be coupled in series to form a notch filter. Likewise, The notch filter 30212 comprises two capacitors, Cp2 and Cg2, and an inductor Lp2. The capacitor Cp2 is coupled to the inductor Lp2 in series to form a circuit, and the circuit is coupled to the capacitor Cg2 in parallel. Alternatively, the inductor Lp2 and the capacitor Cg2 can be coupled in series to form a notch filter. The notch filters, 30211 and 30212, suppress the first-order harmonic. The harmonic generator generates a variety of harmonics. The harmonics having frequencies more than three times of the fundamental frequency can be neglected due to the low power thereof which would affect neither the inputs nor the outputs of the subsequent circuits. For the present invention, the subsequent circuits are the harmonic suppressor 302 and the oscillator 303.

The harmonic suppression circuit 3022 comprises two transistors $M_5$ and $M_6$, two capacitors Cc1 and Cc2, and two resistors Rb1 and Rb2. The transistors $M_5$ and $M_6$ comprise two gates, $G_5$ and $G_6$, two drains, $D_5$ and $D_6$, and two sources $S_5$ and $S_6$, respectively. The capacitor Cc1 has two ends, $P_9$ and $P_{11}$. The capacitor Cc2 has two ends, $P_{10}$ and $P_{12}$. The resistor Rb1 has two ends, $P_{13}$ and $P_{15}$. The resistor Rb2 has two ends, $P_{14}$ and $P_{16}$.

The gate $G_5$ is coupled to the ends $P_{10}$ and $P_{13}$. The gate $G_5$ is coupled to the ends $P_9$ and $P_{14}$. The capacitor Cg1 has an end $P_{17}$, which is coupled to the ends $P_3$, $P_{13}$ and the source $S_5$. The capacitor Cg2 has an end $P_{18}$, which is couple to the ends $P_4$, $P_{12}$ and the source $S_6$. The ends $P_{15}$, $P_{16}$ are coupled to a voltage source Vdd2. The resistor Rb1 is used as a bias resistor for providing bias to the transistor $M_5$. The resistor Rb2 is used as a bias resistor for providing bias to the transistor $M_6$. The harmonic suppressing circuit is employed for suppressing the even-number-order harmonics.

The oscillator 303 comprises transistors $M_1$ and $M_2$, inductors Ls1 and Ls2, and a bias current source 3031. The inductor Ls1 has two ends $P_{19}$ and $P_{21}$. The inductor Ls2 has two ends $P_{20}$ and $P_{22}$. The gate $G_1$ of the transistor $M_1$ is coupled to the drain $D_2$ of the transistor $M_2$ as well as the end $P_{20}$ of the inductor Ls2. The gate $G_2$ of the transistor $M_2$ is coupled to the drain $D_1$ of the transistor $M_1$ as well as the end $P_{19}$ of the inductor Ls1. The source $S_1$ of the transistor $M_1$ and the source $S_2$ of the transistor $M_2$ are coupled to the bias current source 3031 to form a common connection. The two ends, $P_{21}$ and $P_{22}$, are coupled to a voltage source Vdd1 to form another common connection, according to the illustration of FIG. 3(B). Either bipolar transistors or field effect transistors are applicable for those transistors set forth above.

According to FIG. 3(B), the frequency multiplier 30 may also generate oscillation signals with a frequency three-times as much as the fundamental frequency $f_0$ with the oscillator 303. In this particular embodiment, the harmonic generator 301 and the harmonic suppressor 302 form a second type of frequency multiplier.

In FIG. 3(B), the positive-phase fundamental signal Vin+ is transmitted into the first transistor $M_3$, while the phase-inversion fundamental signal Vin− is transmitted into the second transistor $M_4$, to produce bias to the two transistors $M_3$ and $M_4$ at appropriate level for generating multi-frequency harmonics. According to the purpose of the present embodiment, the design of the harmonic generator 301 is to generate the current of the signal having the frequency three times of the fundamental frequency $f_0$, or triple-frequency current, as much as possible. The output impedance of the harmonic generator 301 is also taken into account. When the first and second transistors $M_3$ and $M_4$ are biased at a non-linear region, in which the output current achieves its maximum, the largest amount of the triple-frequency current can be obtained.

Figure 4:
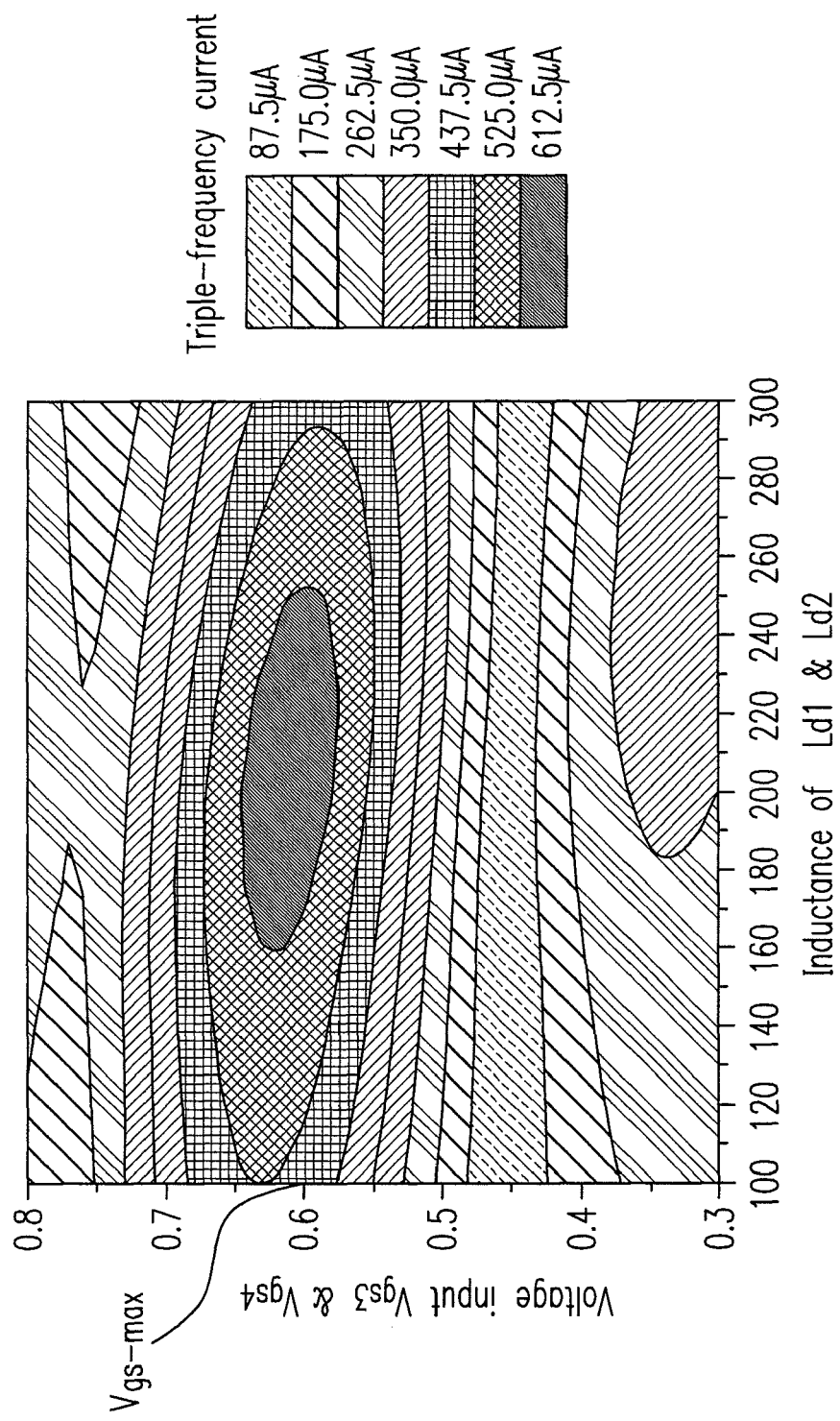
FIG. 4 shows the relation between the input voltage and the inductance of the inductors in terms of the triple-frequency current.

Please refer to FIG. 4, which schematics the relation between the input voltages and the inductance of the inductors in terms of the triple-frequency current, in accordance with the first embodiment of the present invention illustrated in FIG. 3(B). According to FIG. 4, the corresponding triple-frequency current for the voltage of two voltage inputs, Vgs3 and Vgs4, versus the inductance of the two inductors, Ld1 and Ld2, can be obtained, and the largest triple-frequency current is obtained when the inductance of both the two inductors, Ld1 and Ld2, is about 200 pH and the voltage of both the voltage inputs, Vgs3 and Vgs4, is about 0.6 volt.

After providing bias to the transistors $M_3$ and $M_4$ at Vgs-max to produce a maximum triple-frequency current, now is to consider the output impedance. Based upon the impedance theory, it can be comprehended that the maximum triple-frequency current output from a circuit is achieved when the circuit's output impedances corresponding to the fundamental frequency $f_0$, two-times the fundamental frequency $f_0$ and three-times the fundamental frequency $f_0$ are short, short and open, respectively. Since the inductors are the elements for achieving such frequency responses, according to the illustration of FIG. 4, the bias Vgs-max is set to 0.6 volt while the inductances of Ld1 and Ld2 200 pH, and the maximum triple-frequency current is obtained.

Figure 5A:
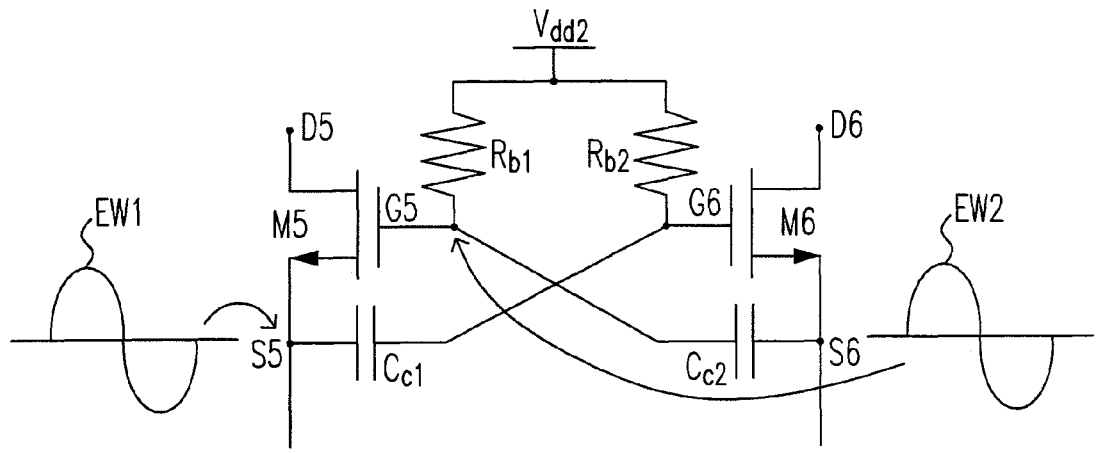
FIG. 5(A) a schematic diagram showing the even-number-order harmonics are suppressed by the harmonic suppressing circuit in accordance with the first embodiment of the present invention.

Please refer to FIG. 5(A), which is a schematic diagram showing the even-number-order harmonics are suppressed by the harmonic suppressing circuit in accordance with the first embodiment of the present invention. An even-number-order harmonic EW1 at the source $S_5$ is the same with another even-number-order harmonic EW2 at the source $S_6$. For the transistor $M_5$, the voltage level of the even-number-order harmonic at the gate $G_5$ is the same with the voltage level at the source $S_5$ at any time. In other words, the voltage Vgs regarding the even-number-order harmonics transmitted into the transistor $M_5$ equals to zero, and the output voltage corresponding to the even-number-order harmonics at the drain $D_5$ is zero. Likewise, as for the transistor $M_6$, the voltage level of the even-number-order harmonic at the gate $G_6$ is the same with the voltage level at the source $S_6$ at any time, and therefore the output voltage corresponding to the even-number-order harmonics at the drain $D_6$ is zero. Thus, the effect of suppressing the even-number-order harmonics is achieved.

Based on the same idea, the harmonic suppression circuit 3022 has the efficacy of increasing the amplitudes of the odd-number-order harmonics whose frequencies is odd-number-time of the fundamental frequency $f_0$ and simultaneously increasing the current of the first-order and the third-order harmonics. The increase of the current of the third-order harmonic is needed to the present invention, while that of the first-order harmonic is not. Therefore, there is a need to manipulate the current of the first-order harmonic as appropriate.

At the time when both the first and the second transistors, $M_3$ and $M_4$, are operating, the first-order harmonic with the fundamental frequency $f_0$ generates the largest amount of current. If a manipulation can be done prior to injecting the harmonics into the oscillator 303 to the reduced current of the first-order harmonic and completely inject the current of the third-order harmonic, a more effective injection can be resulted in. So according to a preferred embodiment of the present invention, the two notch filters 30211 and 30212 are employed to achieve the efficacy of filtering the first-order harmonic.

Figure 5B:
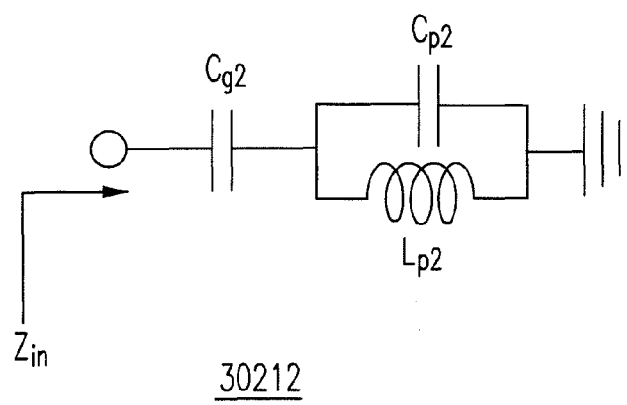
FIG. 5(B) shows a circuit diagram of the notch filter according to the first embodiment.

Please refer to FIG. 5(B), which illustrates a circuit diagram of the notch filter according to the first embodiment of the present invention. According to FIG. 5(B), the capacitor Cp2 and the inductor Lp2 are coupled in parallel to form a circuit having high impedance for the triple-frequency signal. The circuit is further coupled to the capacitor Cg2 in series to achieve low impedance for the fundamental frequency signal. Provided that the fundamental frequency F0 is 20 GHz, the frequency of the triple-frequency signal is 60 GHz. The formula indicating the calculation for the input impedance is show as below, where Cg, Cp and Lp indicate the capacitances of the capacitors Cg2, Cp2, and the inductance of the inductor Lp2, respectively:

$$Zin = \frac{1}{sCg} + \frac{sLp * \frac{1}{sCp}}{sLp + \frac{1}{sCp}} = \qquad \text{Equation 1}$$

$$\frac{1}{sCg} + \frac{sLp}{1 + S^2 LpCp} = \frac{1 + S^2 Lp(Cp + Cg)}{s(1 + S^2 LpCp)Cg}$$

The circuit design according to the present invention is to let the equivalent impedance calculated based on the values of Cg, Cp and Lp be a low impedance for a signal with a frequency of 20 GHz, to allow the current of the first-order harmonic drain off to the ground. As for the triple-frequency signal of 60 GHz, the equivalent impedance is a high impedance, so the current of the triple-frequency signal is prevented to drain of to the ground.

According to the equation 1, it can be derived that:

$$20 \text{ GHz} = \frac{1}{2\pi\sqrt{Lp(Cp + Cg)}},$$

$$60 \text{ GHz} = \frac{1}{2\pi\sqrt{LpCp}} \Rightarrow \sqrt{\frac{Cp + Cg}{Cp}} = 3 \Rightarrow Cg = 8Cp$$

Based on the above, it is observed that the value of Cp is multiple to that of Cg. Due to the influence of process drift, the chosen value of the inductance Lp shall not be too small. According to the above-mentioned aspect, a circuit for drain out the first-order harmonic can be designed. The similar idea can by adopted for designing the notch filter 30211.

Again, referring to FIG. 3(B), parasitical capacitances Cgs2, Cgs1 may exist between the gage G2 and the source S2 and between the gate G1 and the source S1, respectively. The capacitors Ls1, Ls2 and the parasitical capacitances Cgs1, Cgs2 form a LC resonance circuit (LC tank) having frequency selectivity. The equivalent circuit formed between the two drains D1 and D2 is a negative impedance of −2/gm, which may utilized for compensating the consumption of oscillation frequency due to the LC Tank resonance circuit. For the purpose of measuring the oscillation frequency of the frequency multiplier 30, a buffer circuit is added therein.

Figure 5C:
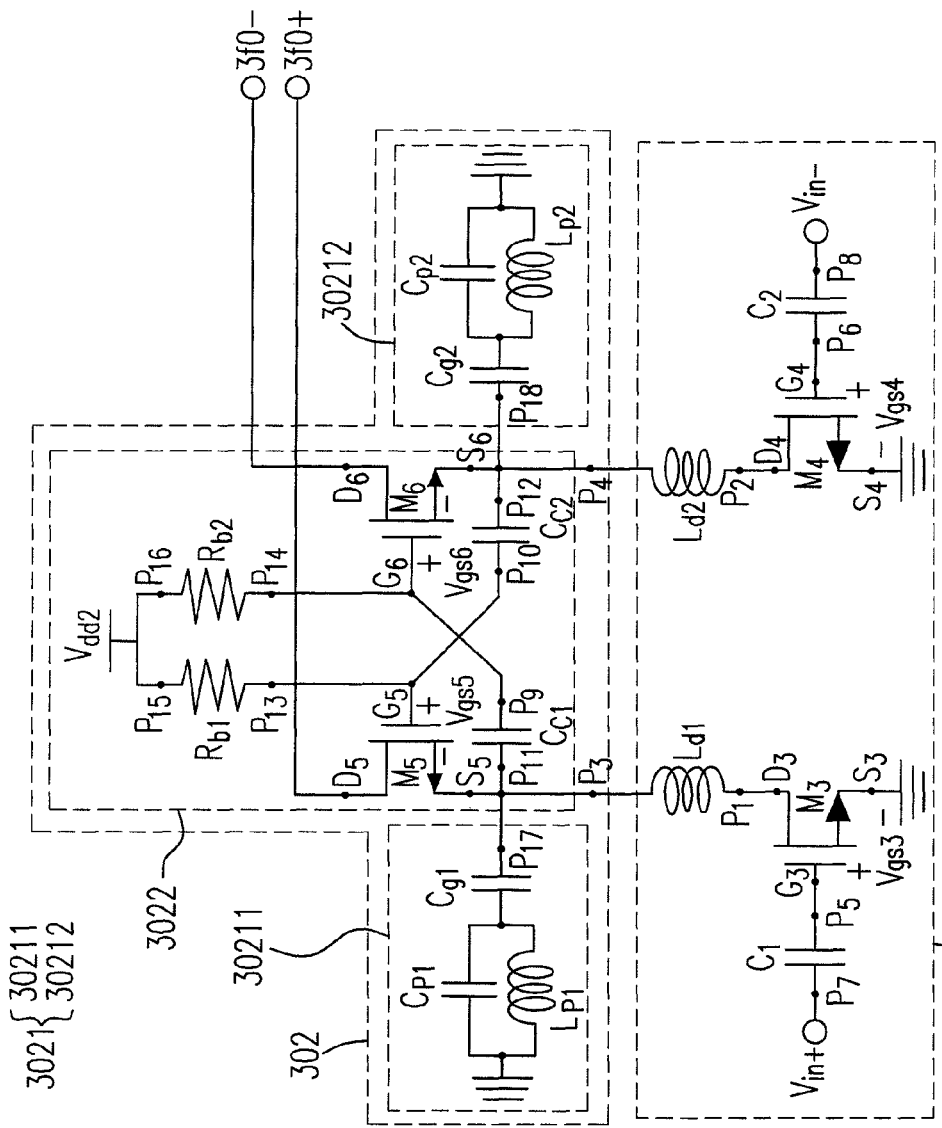
FIG. 5(C) shows a circuit diagram of the frequency multiplier device according to the second embodiment of the present invention.

Please refer to FIG. 5(C), which illustrates a circuit diagram of the frequency multiplier device according to the second embodiment of the present invention. According to FIG. 5(B), the frequency multiplier 50 comprises a harmonic generator 301 and a harmonic suppressor 302. The harmonic generator 301 receives an input signal $S_D$ and generates a harmonic signal $S_H$ with a voltage $V_x$. The harmonic signal $S_H$ includes a first harmonic component $S_{HD1}$ and a second harmonic component $S_{HD2}$. The first harmonic component $S_{HD1}$ comprises a first-order harmonic having the fundamental frequency $f_0$ and plural even-number-order harmonics, each of which has a frequency of even-number times of the fundamental frequency $f_0$. The second harmonic component $S_{HD2}$ comprises a third-order harmonic having a frequency equal to three-time of the fundamental frequency $f_0$. The harmonic suppressor 302 comprises a filter set 3021 and a harmonic suppression circuit 3022. The harmonic suppressor 302 receives the harmonic signal $S_H$, and outputs the second harmonic component $S_{HD2}$, which comprises the third-order harmonic having a frequency three times as much as the fundamental frequency $f_0$. According to the second embodiment of the present invention, the third-order harmonic is inputted from the drain $D_5$ of the transistor $M_5$ and the drain $D_6$ of the transistor $M_6$.

Figure 6:
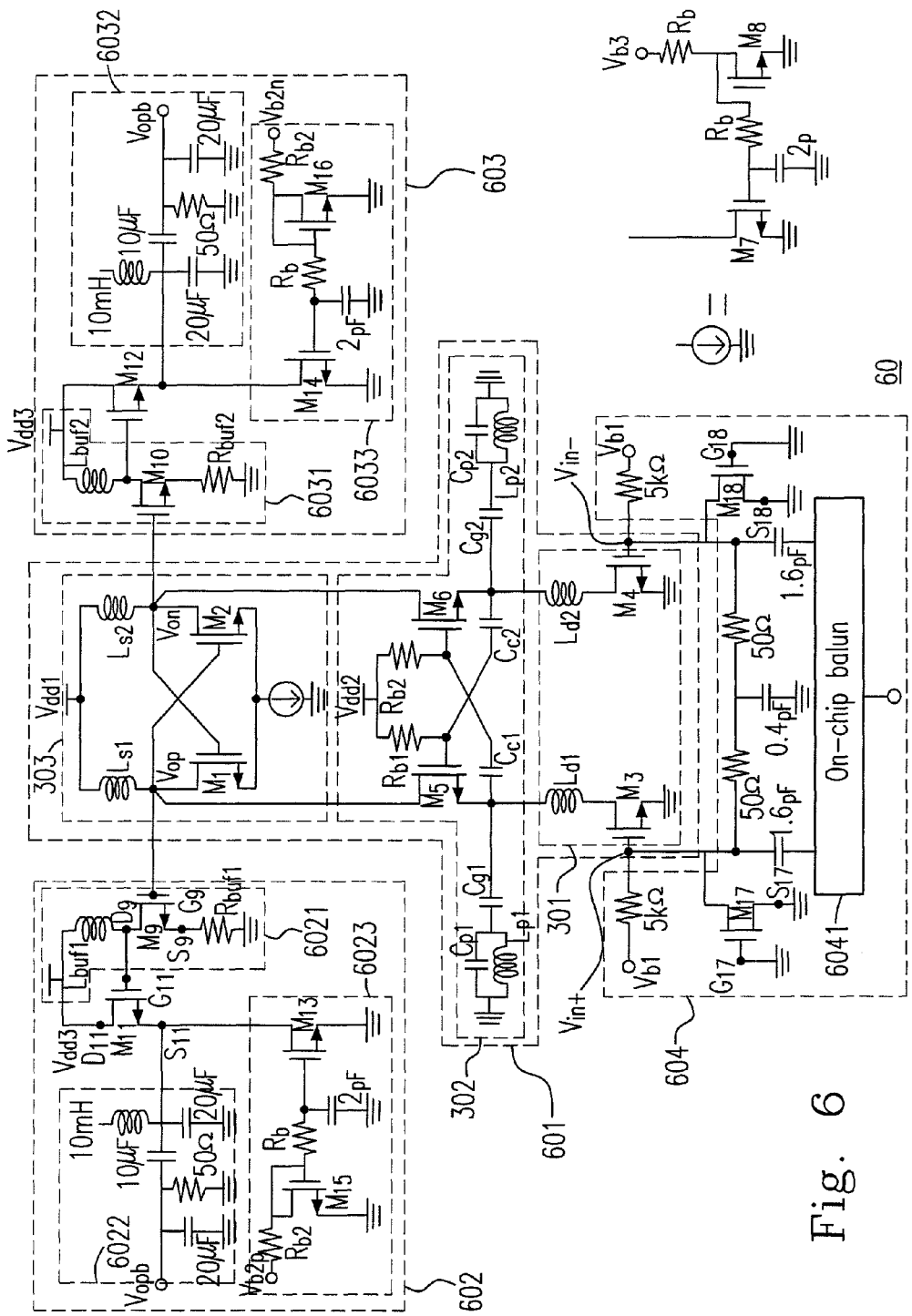
FIG. 6 is a circuit diagram of the circuit for measuring the oscillation frequency according to the first embodiment of the present invention.

Please refer to FIG. 6, which illustrates a circuit diagram of the circuit for measuring the oscillation frequency according to the first embodiment of the present invention. The circuit for measuring the oscillation frequency 60 comprises a frequency multiplier device 601, measurement circuits 602, 603 and a differential signal balancing circuit 604. The frequency multiplier device 601 comprises the harmonic generator 301, the harmonic suppressor 302 and the oscillator 303. Likewise, without the oscillator 303, the frequency multiplier device 601 still can output a signal with a frequency 3 times as much as the fundamental frequency $F_0$. The measurement circuit 602 includes a first stage buffer 6021, a transistor $M_{11}$ as a second stage buffer, an equivalent model of measured instrument 6022 and a bias circuit 6023. The measurement circuit 603 includes a first stage buffer 6031, a transistor $M_{12}$ as a second stage buffer, an equivalent model of measured instrument 6032 and a bias circuit 6033. The differential signal balancing circuit 604 includes a signal-balancing device 6041 and plural transistors, resistors and capacitors.

The difference between the frequency multiplier device 601 and the frequency multiplier device 30 is that the inputted phase differential signal Vin+ and the inverse phase differential signal Vin− for the frequency multiplier device 601 are generated by the signal-balancing device 6041. After the fundamental frequency $F_0$, which ranges from 19 to 22 GHz, fed into the signal-balancing device 6041, the signal-balancing device 6041 generates the positive phase differential signal Vin+ and the inverted phase differential signal Vin−. Two capacitors of 1.6 pF are used for AC-coupling to the positive phase differential signal Vin+ and the inverted phase differential signal Vin−. The capacitor of 0.4 pF is for AC-coupling to the ground. Two resistors of 50 ohm are for matching the input impedance. Two resistors of 5 kilo-ohm are for providing voltage bias for the first and the second transistors, $M_3$ and $M_4$, to a voltage Vb1. The transistors $M_{17}$ and $M_{18}$ are employed for ESD protection to prevent the frequency multiplier device 601 from ESD damage.

According to FIG. 6, the first-order buffer 6021 comprises a transistor $M_9$, a capacitor Lbuf1 and a resistor Rbuf1. The triple-frequency signal, which has a frequency 3 times as high as the fundamental frequency $f_0$, is outputted at the ends Vop and Von. To avoid too much loading that affects the oscillation, the measuring circuits, 602 and 603, provided by the present invention utilize second stage buffers and less scaled transistors. Since the buffers are coupled to the oscillator, the input capacitance of the buffers shall be taken into account. The common-source amplifier with small device size is utilized. The source S9 of the common-source amplifier is coupled to the resistor Rbuf1 having appropriate resistance for avoiding the transistor M9 destroyed by excessive DC current. The inductive reactance of the inductor Lbuf1 is the loading impedance of the first buffer 6021. The drain D9 is coupled to the gate G11. The transistor M11 is used as the source follower and the second-order buffer as well, which serves the function of magnifying the oscillation signal. The source follower outputs oscillation signals at the source S11. Having lower output impedance, the source follower can match the equivalent impedance of the low impedance circuit 6022.

The low impedance circuit 6022 is for simulating a probe to contact the output end of the second-order buffer. The equivalent impedance of the probe is 50 ohm. The voltage bias circuit 6023 is a current mirror, which provides bias voltage to the transistor $M_{11}$. Likewise, the first-order buffer 6031 comprises a transistor $M_{10}$, a capacitor Lbuf2 and a resistor Rbuf2. The low impedance circuit 6032 is for simulating a probe to contact the output end of the second-order buffer. The equivalent impedance of the measured instrument is 50 ohm. The voltage bias circuit 6033 is a current mirror, which provides bias voltage to the transistor $M_{12}$.

Figure 7A:
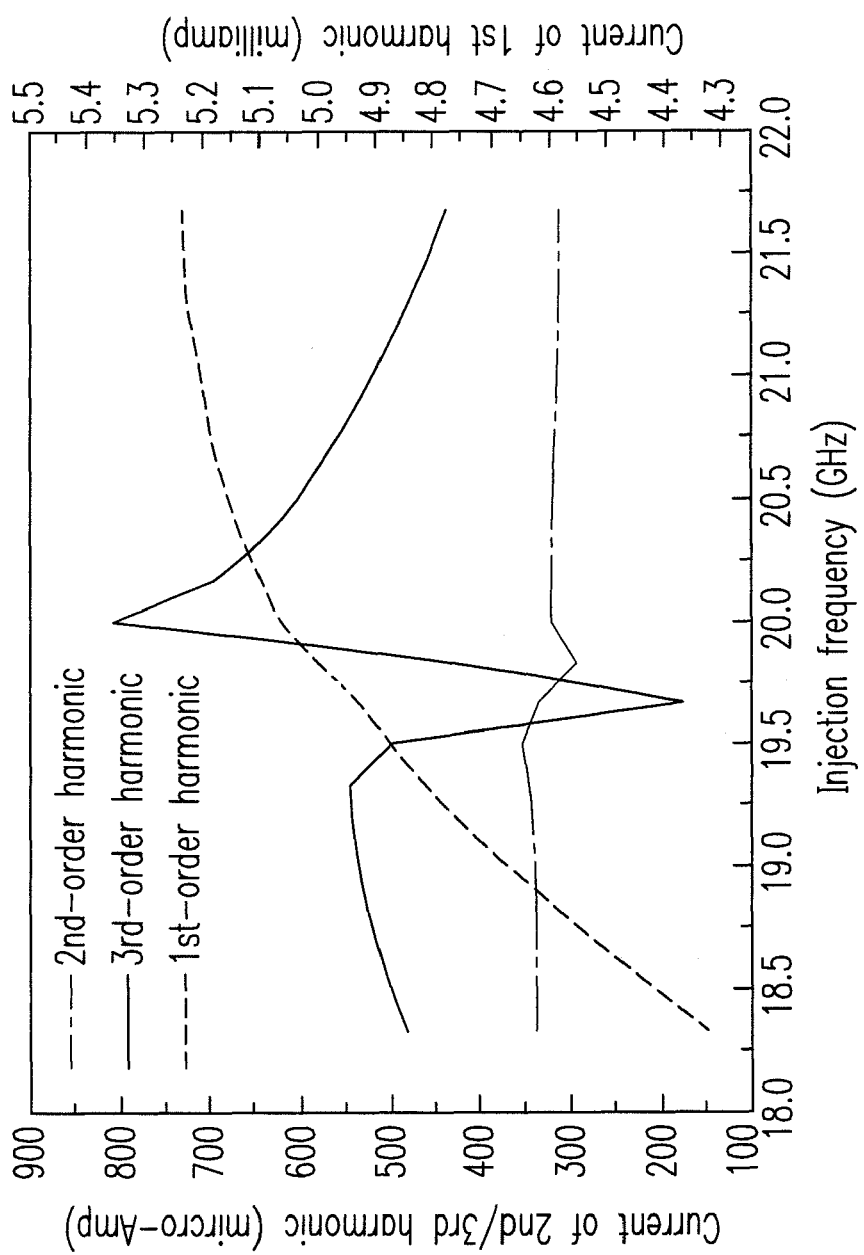
FIG. 7(A) illustrates the relation between the frequency and the current of harmonics, according to the first embodiment of the present invention.

Please refer to FIG. 7(A), which illustrates the relation between the frequency and the current of harmonics, according to the first embodiment of the present invention. It can be observed from the illustration of FIG. 7(A) that, the current of the second-order harmonic is suppressed to around 350 micro-amp, the current of the first-order harmonic with the fundamental frequency f0 of 20 GHz is around 5.05 milliamp, and the current of the third-order harmonic having the triple frequency of 60 GHz is around 800 micro-amp.

Figure 7B:
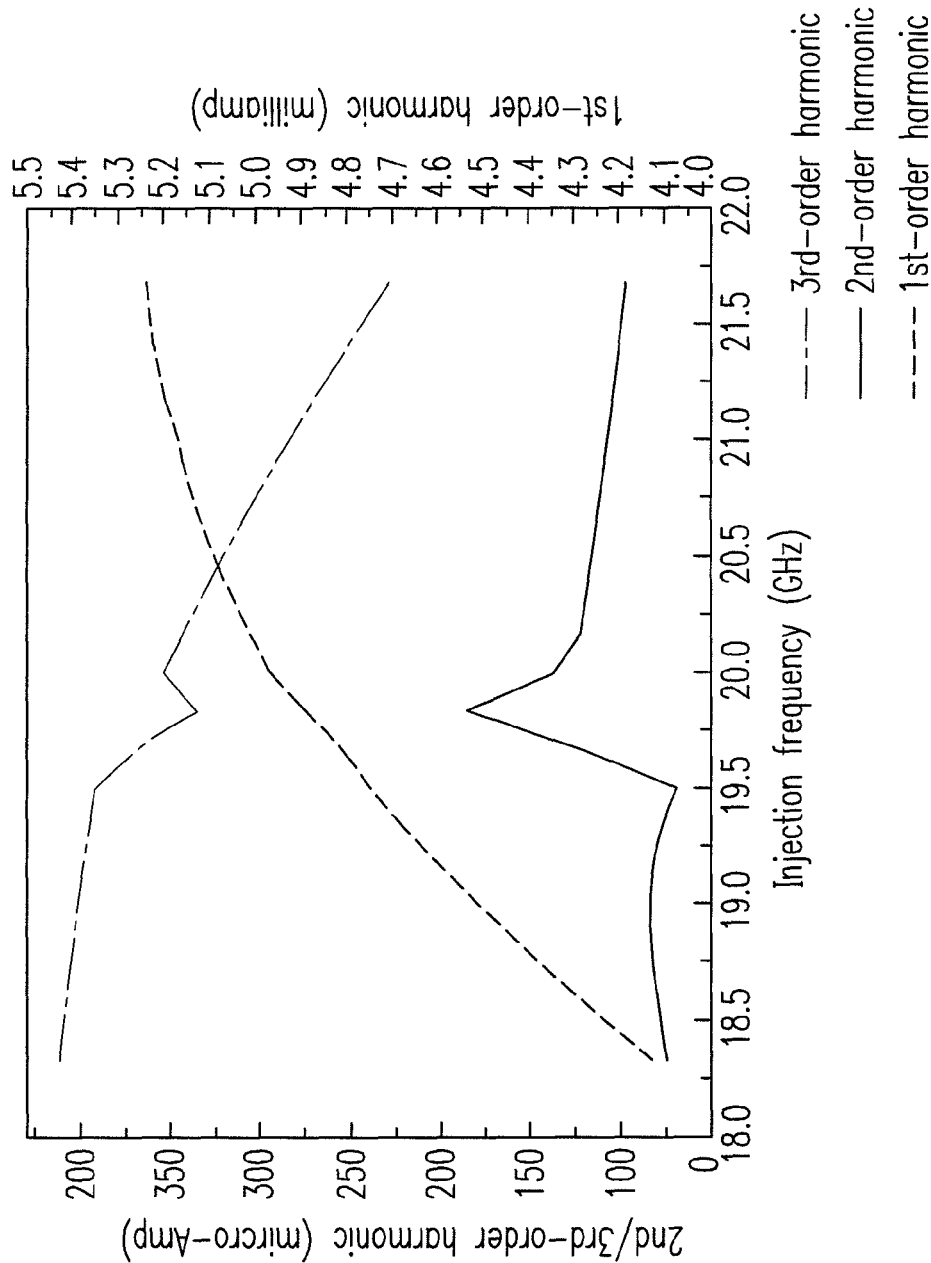
FIG. 7(B) illustrates the relation between the frequency and the current consumption of the harmonics according to the first embodiment of the present invention.

Please refer to FIG. 7(B), which illustrates the relation between the frequency and the current consumption of the harmonics according to the first embodiment of the present invention. According to FIG. 7(B), the consumed current of the first-order harmonic having the fundamental frequency f0 of 20 GHz is relatively high, which is due to the low impedance of the notch filter 30212 for the frequency of 20 GHz so as to drain the first-order harmonic to the ground and improve the HRR. The current consumption of the second-order harmonic is also high, while the current consumption of the third-order harmonic is almost the same as the current of the third-order harmonic illustrated in FIG. 4, which indicates the consumed current of the third-order harmonic is indeed the output current thereof.

Figure 7C:
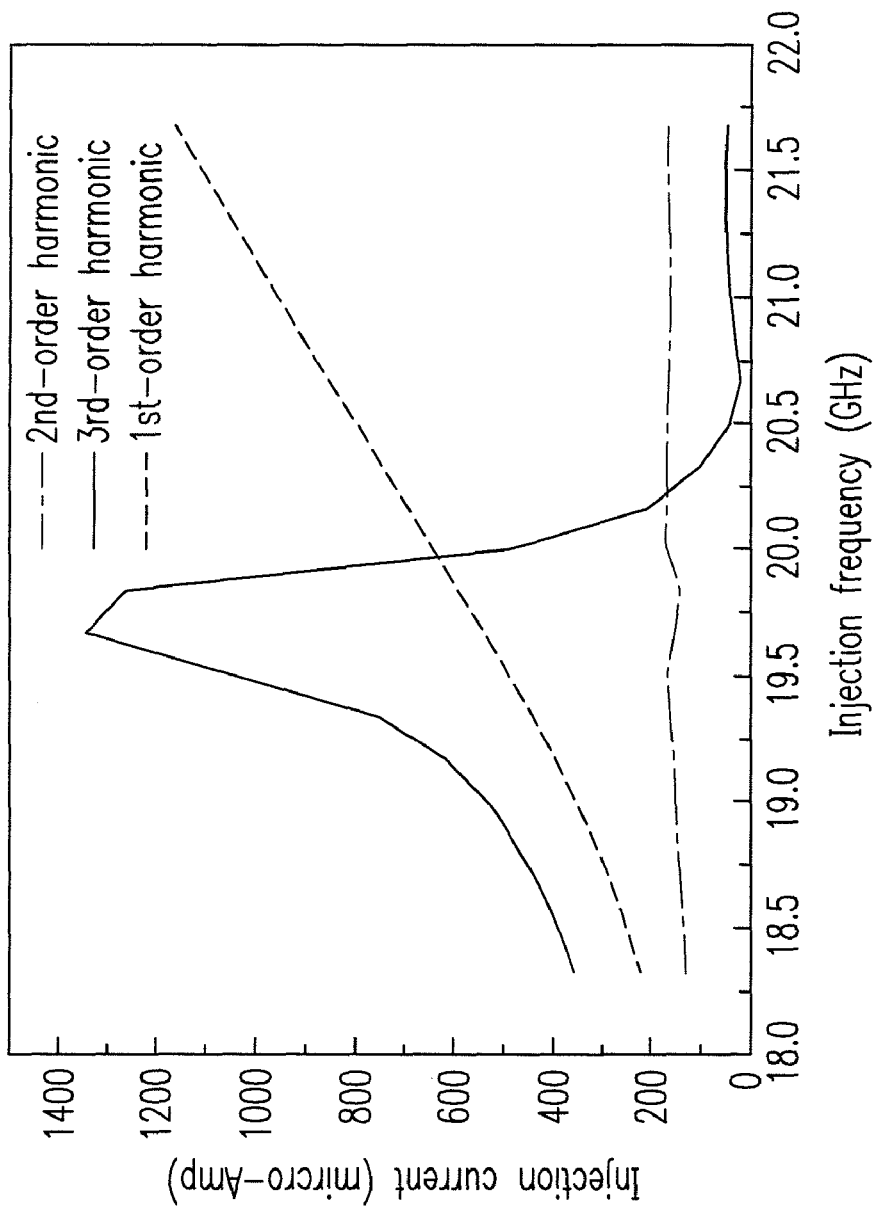
FIG. 7(C) illustrates the relation between the current and frequency of the harmonics injected into the oscillator according to the first embodiment of the present invention.

Please refer to FIG. 7(C), which illustrates the relation between the current and frequency of the harmonics injected into the oscillator according to the first embodiment of the present invention. According to the illustration of FIG. 7(C), the current of the second-order harmonic injected to the oscillator 303 is suppressed to 200 micro-amp and even lower, the current of the first-order harmonic to 600 micro-amp and lower, and the current of the third-order harmonic is around 1300 micro-amp. Thus, the current of the third-order harmonic is fully injected into the oscillator 303.

Figure 7D:
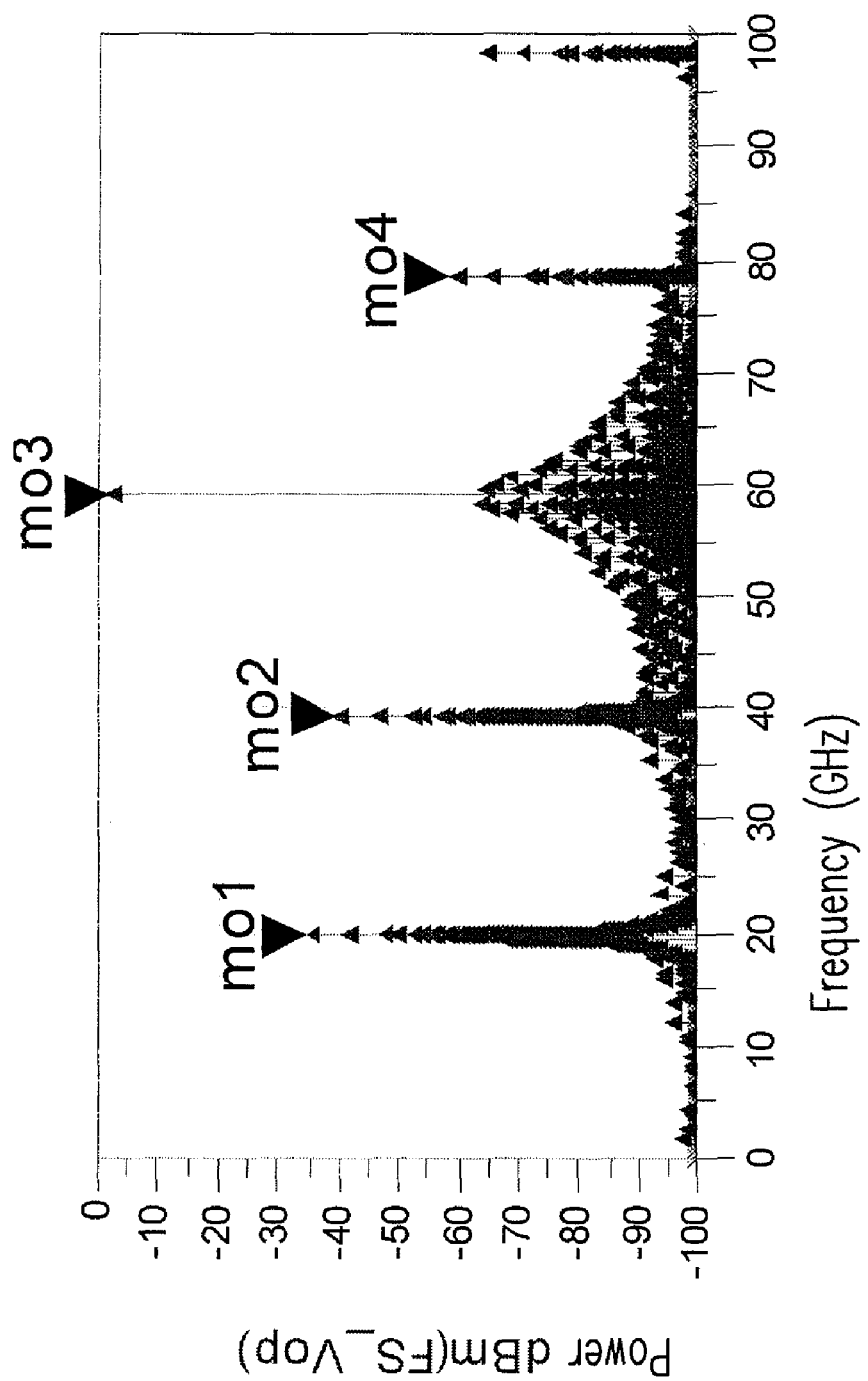
FIG. 7(D) schematics the power of the harmonics according to the first embodiment of the present invention.

Please refer to FIG. 7(D), which schematics the power of the harmonics according to the first embodiment of the present invention. According to FIG. 7(D), the power of the first-order, the second-order and the third-order harmonics are illustrated as mo1, mo2 and mo3 respectively. It is observed the power of the third-order harmonic having a frequency of 60 GHz is zero dBm.

Figure 7E:
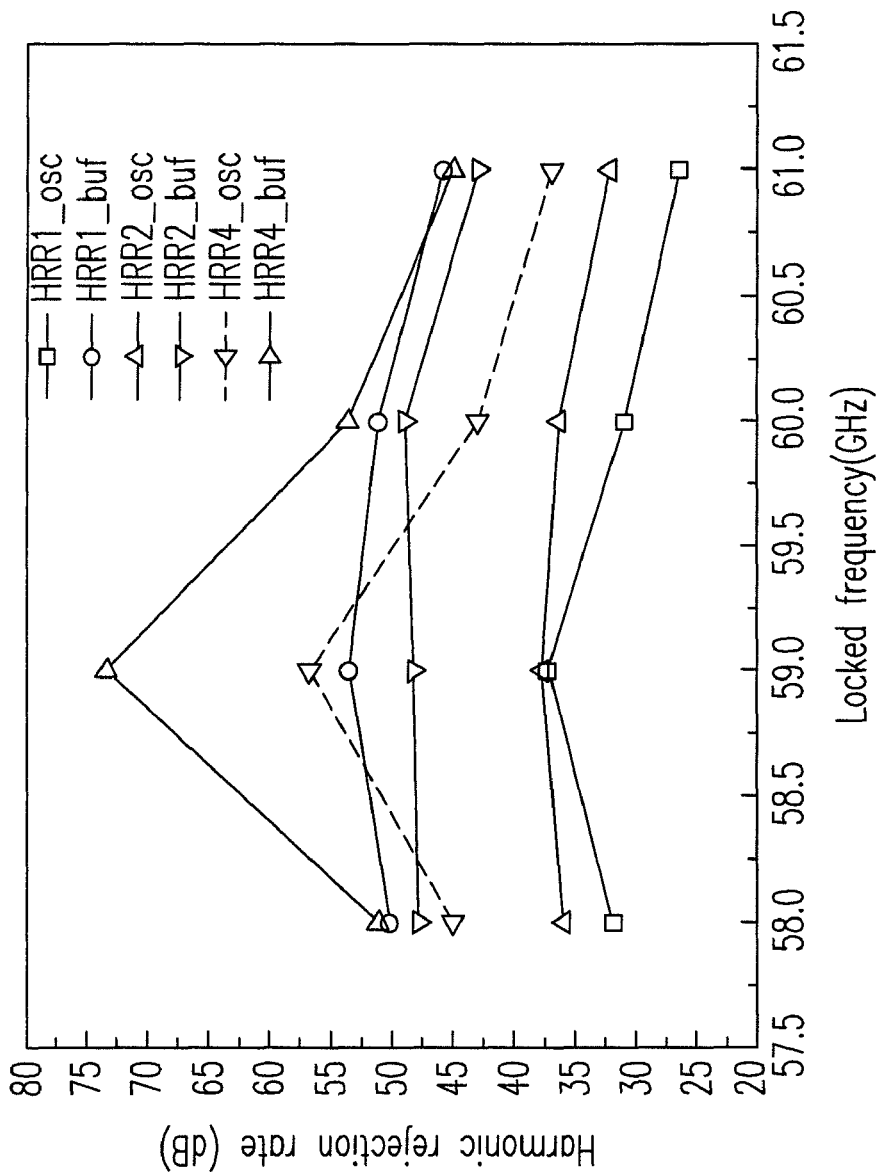
FIG. 7(E) schematics the HRR of the harmonics according to the first embodiment of the present invention.

Please refer to FIG. 7(E), which schematics the HRR of the harmonics according to the first embodiment of the present invention. The HRR corresponding to each of the harmonics are above 30 dB at the oscillation frequency of 60 GHz.

Figure 7F:
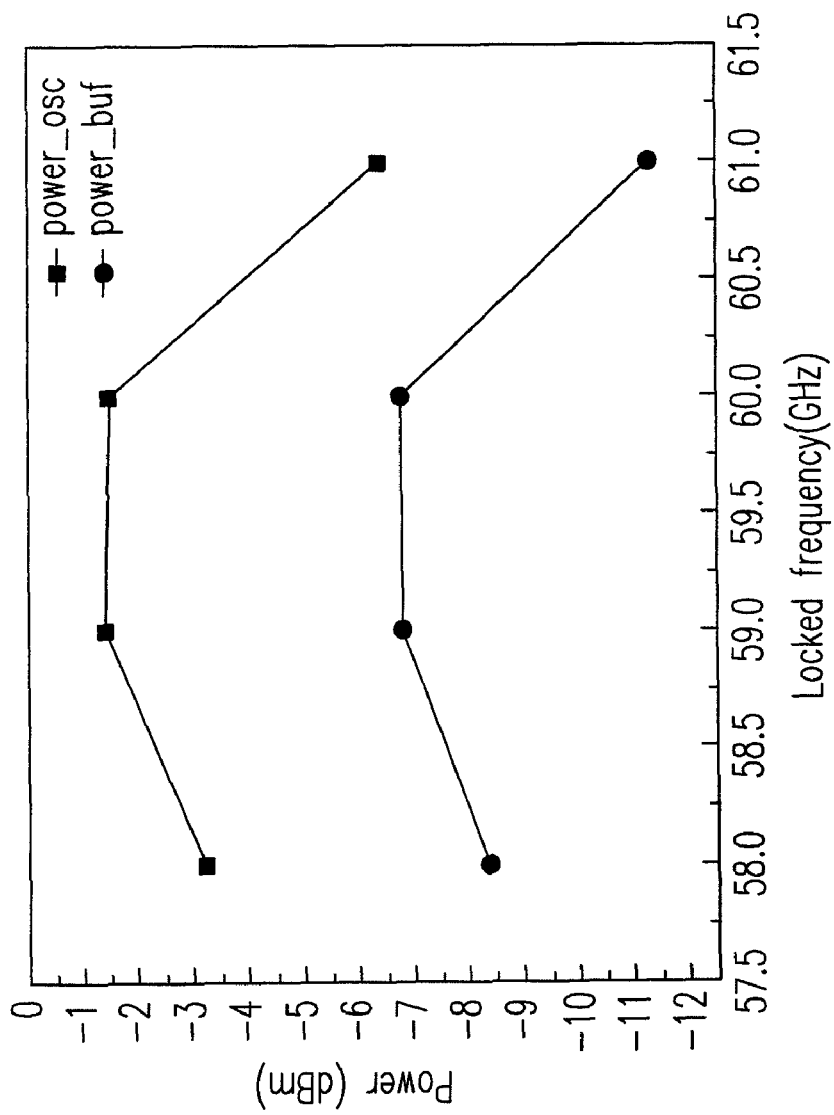
FIG. 7(F) schematics the output power of the oscillation and the buffer according to the first embodiment of the present invention.

Please refer to FIG. 7(F), which schematics the output power of the oscillation (power_osc) and that of the buffer (power_buf), according to the first embodiment of the present invention. According to the illustration of FIG. 7(F), the output power of both the oscillator and the buffer achieve a maximum when the locked frequency is around 59 to 60 GHz.

Figure 7G:
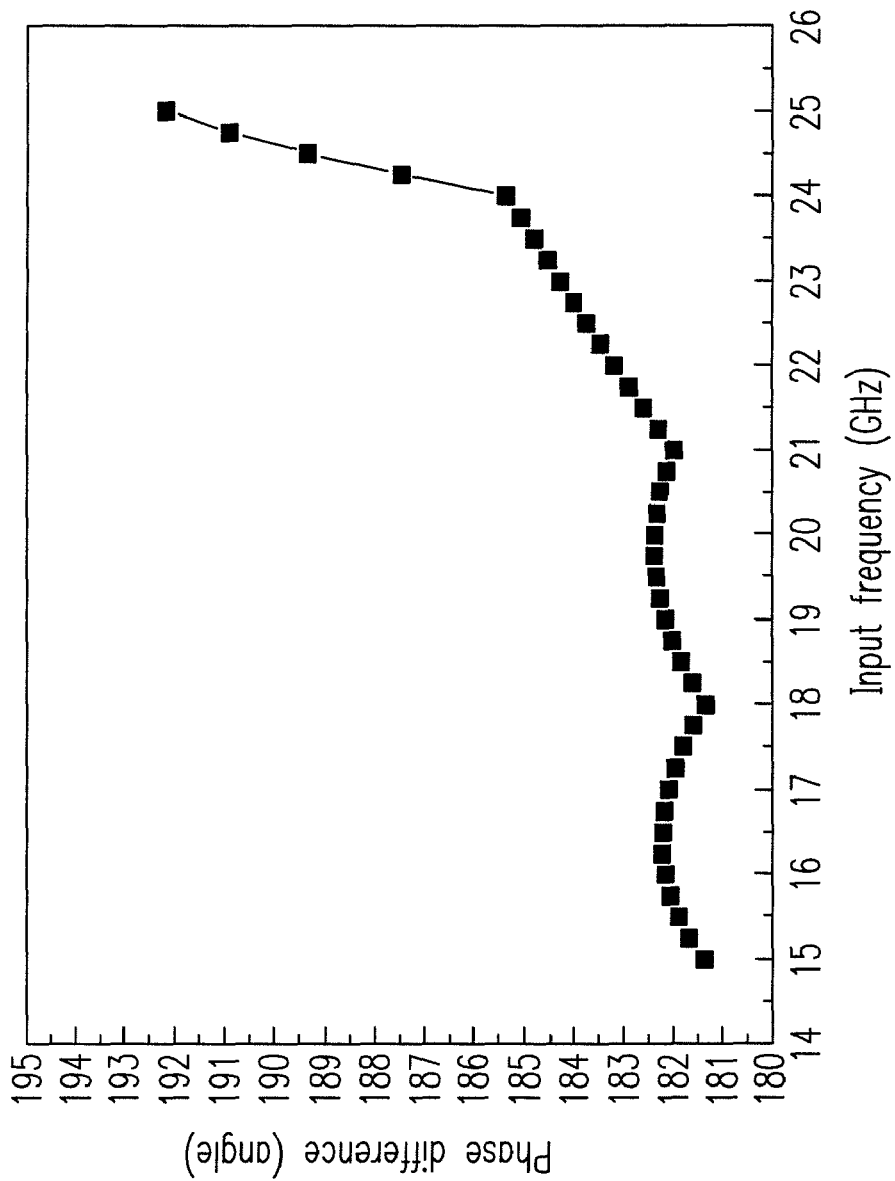
FIG. 7(G) shows the relation between the phase of the output signal of the signal balancing device and the frequency, according to the first embodiment of the present invention.

Please refer to FIG. 7(G), which schematics the relation between the phase of the output signal of the signal balancing device and the frequency, according to the first embodiment of the present invention. According to the illustration of FIG. 7(G), the phase difference between the positive phase differential signal Vin+ and the inverted phase differential signal Vin− is around 182 degree, when the input frequency is 20 GHz. To suppress the even-number-order harmonics, the phase difference shall be maintained at 180 degree.

Figure 8A:
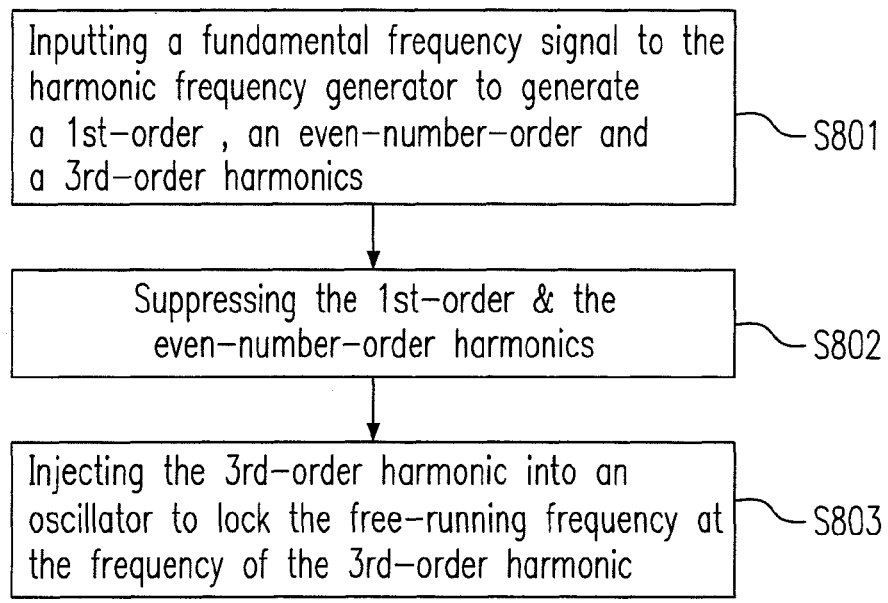
FIG. 8(A) is a flow chart showing the operation process of the frequency multiplier device according to the first embodiment of the present invention.

Please refer to FIG. 8(A), which is a flow chart showing the operation process of the frequency multiplier device 30 according to the first embodiment of the present invention. The operation process includes steps of: (S801) inputting a fundamental frequency signal to the harmonic frequency generator 301 to generate a $1^{st}$-order, an even-number-order and a $3^{rd}$-order harmonics; (S802) suppressing the $1^{st}$-order and the even-number-order harmonics; and (S803) injecting the $3^{rd}$-order harmonic into an oscillator 303 to lock the free-running frequency at the frequency of the $3^{rd}$-order harmonic. The operation method of the frequency multiplier device 30 further includes the following step: to actuate the oscillator.

Figure 8B:
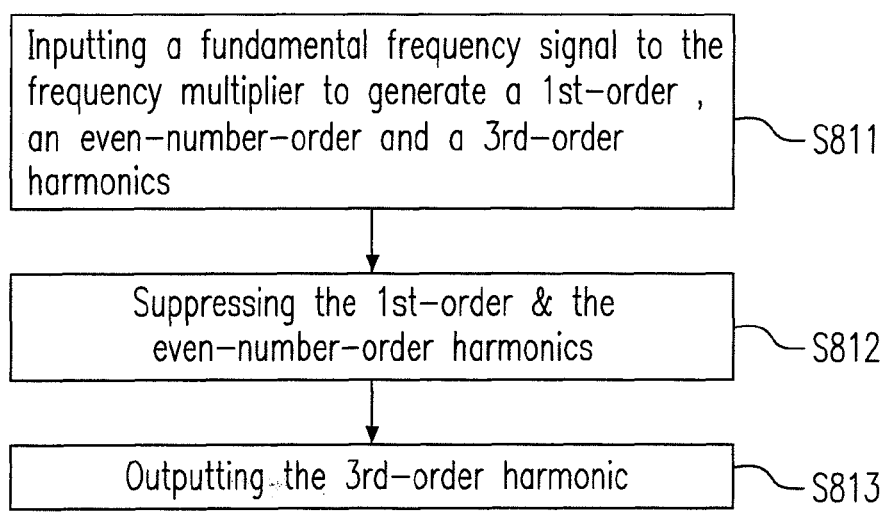
FIG. 8(B) is a flow chart showing the operation process of the frequency multiplier device according to the second embodiment of the present invention.

Please refer to FIG. 8(B), which is a flow chart showing the operation process of the frequency multiplier device according to the second embodiment of the present invention. Referring to FIG. 3(B), the oscillator 303 is eliminated according to the alternative design of the frequency multiplier device 30. The operation process of the alternative design of the frequency multiplier device 30 includes the steps: (S811) inputting a fundamental frequency signal to the frequency multiplier to generate a $1^{st}$-order, an even-number-order and a $3^{rd}$-order harmonics; (S812) suppressing the $1^{st}$-order and the even-number-order harmonics; and (S813) outputting the $3^{rd}$-order harmonic.

Based on the above, the present invention adopts the method of suppressing the first-order and the even-number-order harmonics and enhancing the third-order harmonic to achieve the objective of obtaining oscillation signals with better quality. While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims that are to be accorded with the broadest interpretation so as to encompass all such modifications and similar structures.

What is claimed is:

1. A frequency multiplier device, comprising:
   a harmonic generator, receiving an input signal having a fundamental frequency, and producing a harmonic signal including a first and a second harmonic components; and
   a harmonic suppressor receiving the harmonic signal, suppressing the first harmonic component, and outputting the second harmonic component, wherein the first harmonic component includes a first-order harmonic having the fundamental frequency and plural even-number-order harmonics, each of which has a frequency of an even-number-time of the fundamental frequency, the second harmonic component includes a third-order harmonic having a frequency equal to three-time of the fundamental frequency, and the harmonic suppressor enhances the second harmonic component.

2. A frequency multiplier device as claimed in claim 1, further comprising a specific harmonic application device receiving the enhanced second harmonic component, wherein the specific harmonic application device is an oscillator having an oscillation frequency and locked at three-time of the fundamental frequency by the third-order harmonic with an injection-locking method.

3. A frequency multiplier device as claimed in claim 1, wherein the harmonic suppressor comprises at least a filter and a harmonic suppression circuit.

4. A frequency multiplier device as claimed in claim 3, wherein the harmonic suppression circuit suppresses the even-order harmonics.

5. A frequency multiplier device as claimed in claim 3, wherein the harmonic suppression circuit comprises a plurality of transistors and a plurality of capacitors.

6. A frequency multiplier device as claimed in claim 3, wherein the filter is a band-stop filter.

7. A frequency multiplier device as claimed in claim 6, wherein the band-stop filter comprises an inductor and a capacitor, and the inductor and the capacitor are coupled in series.

8. A frequency multiplier device as claimed in claim 6, wherein the band-stop filter comprises a first capacitor, an inductor and a second capacitor, the first capacitor is coupled to the inductor in parallel to for a first circuit, and the second capacitor is coupled to the first circuit in series.

9. A frequency multiplier device as claimed in claim 6, wherein the band-stop filter suppresses the first-order harmonic.

10. A frequency multiplier device as claimed in claim 9, wherein the plurality of transistors include one of a bi-polar transistor and a field-effect transistor.

11. A frequency multiplier device as claimed in claim 9, wherein:
    the plurality of transistors comprise:
       a first transistor having a first gate, a first drain, and a first source; and
       a second transistor having a second gate, a second drain, and a second source; and
    the plurality of capacitors comprise:
       a first capacitor having a first and a third ends; and
       a second capacitor having a second and a fourth ends, wherein the first gate is coupled to the fourth end, the second gate is coupled to the third end, the first source is coupled to the first end, and the second source is coupled to the fourth end.

12. A frequency multiplier device as claimed in claim 1, wherein the harmonic generator is a differential circuit.

13. A frequency multiplier device as claimed in claim 1, wherein the input signal comprises a non-phase-inversion fundamental signal and a phase-inversion fundamental signal.

14. A frequency multiplier device as claimed in claim 1, wherein the harmonic generator comprises a plurality of transistors, a plurality of capacitors and a plurality of inductors.

15. A frequency multiplier device as claimed in claim 14, wherein:
    the plurality of transistors comprise:
       a first transistor having a first gate, a first drain, and a first source; and
       a second transistor having a second gate, a second drain, and a second source,
    the plurality of inductors comprise:
       a first inductor having a first and a third ends; and
       a second inductor having a second and a fourth ends, and
    the plurality of capacitors comprise:
       a first capacitor having a fifth and a seventh ends; and a second capacitor having a sixth and an eighth ends, wherein the first drain is coupled to the first end, the second drain is coupled to the second end, the first and the second sources are grounded, the fifth end is coupled to the first gate, the sixth end is coupled to the second gate, the non-phase-inversion fundamental signal is input into the seventh end, and the phase-inversion fundamental signal is input into the eighth end.

16. A frequency multiplier device as claimed in claim 14, wherein the plurality of inductors enhance the third-order harmonic.

17. A method for processing a signal having a fundamental frequency, comprising steps of: producing a harmonic signal including a first and a second harmonic components; (b) suppressing the first harmonic component; and (c) outputting the second harmonic component, wherein the first harmonic component comprises a first-order harmonic having the fundamental frequency and plural even-number-order harmonics, each of which has a frequency of an even-number-times of the fundamental frequency, the second harmonic component comprises a third-order harmonic having a frequency equal to three-time of the fundamental frequency, and the harmonic suppressor enhances the second harmonic component.

18. A method as claimed in claim 17, further comprising steps of:
(c1) injecting the third-order harmonic into an oscillator to lock an oscillation frequency at the third-order harmonic; and
(d) actuating the oscillator.

* * * * *